United States Patent
Saitoh et al.

(10) Patent No.: US 10,256,346 B2
(45) Date of Patent: Apr. 9, 2019

(54) METHOD FOR MANUFACTURING A SEMICONDUCTOR DEVICE WHERE A PLURALITY OF LAYERS INCLUDING A SEMICONDUCTOR LAYER MADE OF AN OXIDE SEMICONDUCTOR ARE STACKED TO FORM A THIN FILM TRANSISTOR

(71) Applicant: Sharp Kabushiki Kaisha, Sakai, Osaka (JP)

(72) Inventors: Takao Saitoh, Sakai (JP); Yohsuke Kanzaki, Sakai (JP); Yutaka Takamaru, Sakai (JP); Keisuke Ide, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/516,434

(22) PCT Filed: Oct. 1, 2015

(86) PCT No.: PCT/JP2015/077900
§ 371 (c)(1),
(2) Date: Apr. 3, 2017

(87) PCT Pub. No.: WO2016/056452
PCT Pub. Date: Apr. 14, 2016

(65) Prior Publication Data
US 2018/0233593 A1    Aug. 16, 2018

(30) Foreign Application Priority Data

Oct. 8, 2014    (JP) ................... 2014-206868

(51) Int. Cl.
*H01L 29/786* (2006.01)
*H01L 27/12* (2006.01)
*C23C 16/42* (2006.01)

(52) U.S. Cl.
CPC .......... *H01L 29/7869* (2013.01); *C23C 16/42* (2013.01); *H01L 27/1225* (2013.01);
(Continued)

(58) Field of Classification Search
None
See application file for complete search history.

(56) References Cited

U.S. PATENT DOCUMENTS

2010/0213459 A1   8/2010   Shimada et al.
2012/0138922 A1   6/2012   Yamazaki et al.
(Continued)

FOREIGN PATENT DOCUMENTS

JP    2009-099944 A    5/2009
JP    2012-134475 A    7/2012
WO    2011/151990 A1   12/2011

OTHER PUBLICATIONS

Official Communication issued in International Patent Application No. PCT/JP2015/077900, dated Dec. 28, 2015.

*Primary Examiner* — Minh Loan Tran
(74) *Attorney, Agent, or Firm* — Keating & Bennett, LLP

(57) ABSTRACT

In a semiconductor device including a semiconductor layer made of an oxide semiconductor, occurrence of variance in the characteristics of TFTs is suppressed. In a manufacturing process of a semiconductor device (100) where a passivation film (17) is to be formed at an upper layer of a semiconductor layer (11) made of an oxide semiconductor, deposition conditions of the passivation film (17) are set such that the proportion of pure metal (the ratio of pure metal to all the components of the semiconductor layer (11)) at an interface of the semiconductor layer (11) to the passivation film (17) becomes higher than the proportion of pure metal in the bulk of the semiconductor layer (11).

10 Claims, 12 Drawing Sheets

(52) U.S. Cl.
CPC ...... *H01L 29/786* (2013.01); *H01L 29/78618* (2013.01); *H01L 29/78696* (2013.01)

(56) References Cited

U.S. PATENT DOCUMENTS

2013/0175521 A1\* 7/2013 Moriguchi .......... H01L 29/7869
                                                                257/43
2015/0235700 A1\* 8/2015 Ohmaru ............. G11C 14/0009
                                                                365/149

\* cited by examiner

METHOD FOR MANUFACTURING A SEMICONDUCTOR DEVICE WHERE A PLURALITY OF LAYERS INCLUDING A SEMICONDUCTOR LAYER MADE OF AN OXIDE SEMICONDUCTOR ARE STACKED TO FORM A THIN FILM TRANSISTOR

TECHNICAL FIELD

The present invention relates to a semiconductor device including a semiconductor layer made of an oxide semiconductor, and a method for manufacturing same.

BACKGROUND ART

A thin film transistor (TFT) having a semiconductor layer (a channel layer) made of an oxide semiconductor such as indium gallium zinc oxide or tin oxide is characteristic in that the operating speed is fast compared to that of a TFT that takes a non-crystalline silicon layer as a semiconductor layer, and in that a crystallization step is not required in contrast to a TFT that takes a polycrystalline silicon layer as a semiconductor layer. Accordingly, in recent years, development of TFTs having a semiconductor layer made of an oxide semiconductor (an oxide semiconductor layer) is being actively pursued.

Like the TFT that takes a non-crystalline silicon layer as a semiconductor layer, the TFT that takes an oxide semiconductor layer as a semiconductor layer is manufactured by various steps of photolithography. Steps of photolithography includes cleaning of a substrate, deposition, resist coating, prebaking, exposure, development, post-baking, etching, resist removal, and the like.

When TFTs that take an oxide semiconductor layer as a semiconductor layer are manufactured by photolithography, characteristics of the TFTs may be varied. Accordingly, Japanese Laid-Open Patent Publication No. 2009-099944 discloses an invention for reducing the variance in the characteristics of the TFTs caused by non-uniform damages incurred to the semiconductor layers at the time of formation of protection layers. According to the invention disclosed in Japanese Laid-Open Patent Publication No. 2009-099944, a semiconductor layer includes a first layer which functions as a channel layer, and a second layer having higher resistance than the first layer (the second layer is provided on the protection layer side of the semiconductor layer). Because the second layer having high resistance is provided at an upper layer of the first layer functioning as a channel layer, the influence exerted on electrical conduction characteristics of a channel region of the TFT by the step of forming a protection layer is made small, and occurrence of variance in the characteristics of the TFTs may be suppressed.

PRIOR ART DOCUMENT

Patent Document

[Patent Document 1] Japanese Laid-Open Patent Publication No. 2009-099944

SUMMARY OF THE INVENTION

Problems to be Solved by the Invention

In a manufacturing process of a TFT by photolithography, wet etching is performed at the time of forming a pattern of a semiconductor layer. Accordingly, a peripheral edge portion and an upper surface portion of the pattern of the semiconductor layer are exposed to etching liquid. The film quality of the peripheral edge portion and the upper surface portion of the pattern of the semiconductor layer is thus easily changed. For example, indium (In), gallium (Ga), and zinc (Zn) are present, as oxides, in an oxide semiconductor layer. However, because the peripheral edge portion and the upper surface portion of the pattern of the semiconductor layer are exposed to etching liquid as described above, the composition ratio is easily changed. As a result, characteristics may be varied among a plurality of TFTs (for example, levels of threshold voltage may be varied). With respect to this point, the invention disclosed in Japanese Laid-Open Patent Publication No. 2009-099944 takes measures for only the upper surface side of the pattern of the semiconductor layer, and thus, the peripheral edge portion of the pattern of the semiconductor layer is exposed to etching liquid and the film quality of the peripheral edge portion is changed. This results in occurrence of variance in the characteristics of a plurality of TFTs. Also, when there are TFTs of different shapes, the variance in the characteristics are considered to be even greater.

Accordingly, the present invention has its object to suppress occurrence of variance in characteristics of TFTs with respect to a semiconductor device including a semiconductor layer made of an oxide semiconductor.

Means for Solving the Problems

A first aspect of the present invention is directed to a semiconductor device where a plurality of layers including a semiconductor layer made of an oxide semiconductor are stacked so as to form a thin film transistor, wherein, in the semiconductor layer, a proportion of pure metal indicating a ratio of pure metal to all components of the oxide semiconductor is higher at an interface of the semiconductor layer to an upper layer than in a bulk.

According to a second aspect of the present invention, in the first aspect of the present invention, the proportion of pure metal at a peripheral edge portion, of a pattern of the semiconductor layer, of the interface is higher than the proportion of pure metal in the bulk.

According to a third aspect of the present invention, in the first aspect of the present invention, the proportion of pure metal at an upper surface portion, of a pattern of the semiconductor layer, of the interface is higher than the proportion of pure metal in the bulk.

According to a fourth aspect of the present invention, in the first aspect of the present invention, both the proportion of pure metal at a peripheral edge portion, of a pattern of the semiconductor layer, of the interface and the proportion of pure metal at an upper surface portion, of the pattern of the semiconductor layer, of the interface are higher than the proportion of pure metal in the bulk.

According to a fifth aspect of the present invention, in the first aspect of the present invention, a passivation film for protecting the semiconductor layer is formed as the upper layer of the semiconductor layer.

According to a sixth aspect of the present invention, in the first aspect of the present invention, an insulating film for insulating a gate electrode of the thin film transistor and the semiconductor layer from each other is formed as the upper layer of the semiconductor layer.

According to a seventh aspect of the present invention, in the first aspect of the present invention, the upper layer of the semiconductor layer is formed from a silicon dioxide film.

According to an eighth aspect of the present invention, in the first aspect of the present invention, the oxide semiconductor is indium gallium zinc oxide.

According to a ninth aspect of the present invention, in the eighth aspect of the present invention, the indium gallium zinc oxide is crystalline.

A tenth aspect of the present invention is directed to a method for manufacturing a semiconductor device where a plurality of layers including a semiconductor layer made of an oxide semiconductor are stacked so as to form a thin film transistor, the method including:

a semiconductor layer formation step of forming the semiconductor layer; and an upper layer formation step of forming an upper layer of the semiconductor layer, wherein, in the upper layer formation step, the upper layer is deposited in such a way that, in the semiconductor layer, a proportion of pure metal indicating a ratio of pure metal to all components of the oxide semiconductor is higher at an interface of the semiconductor layer to the upper layer than in a bulk.

According to an eleventh aspect of the present invention, in the tenth aspect of the present invention, in the upper layer formation step, the upper layer is deposited in such a way that the proportion of pure metal at a peripheral edge portion, of a pattern of the semiconductor layer, of the interface is higher than the proportion of pure metal in the bulk.

According to a twelfth aspect of the present invention, in the tenth aspect of the present invention, in the upper layer formation step, the upper layer is deposited in such a way that the proportion of pure metal at an upper surface portion, of a pattern of the semiconductor layer, of the interface is higher than the proportion of pure metal in the bulk.

According to a thirteenth aspect of the present invention, in the tenth aspect of the present invention, in the upper layer formation step, the upper layer is deposited in such a way that both the proportion of pure metal at a peripheral edge portion, of a pattern of the semiconductor layer, of the interface and the proportion of pure metal at an upper surface portion, of the pattern of the semiconductor layer, of the interface are higher than the proportion of pure metal in the bulk.

According to a fourteenth aspect of the present invention, in the tenth aspect of the present invention, in the upper layer formation step, a passivation film is formed as the upper layer of the semiconductor layer.

According to a fifteenth aspect of the present invention, in the tenth aspect of the present invention, in the upper layer formation step, an insulating film for insulating a gate electrode of the thin film transistor and the semiconductor layer from each other is formed as the upper layer of the semiconductor layer.

According to a sixteenth aspect of the present invention, in the tenth aspect of the present invention, the upper layer of the semiconductor layer is formed from a silicon dioxide film.

According to a seventeenth aspect of the present invention, in the sixteenth aspect of the present invention, in the upper layer formation step, deposition temperature for depositing the silicon dioxide film is set to 150 degrees or higher and 250 degrees or lower.

According to an eighteenth aspect of the present invention, in the sixteenth aspect of the present invention, in the upper layer formation step, deposition power for depositing the silicon dioxide film is set to at least 800 W.

According to a nineteenth aspect of the present invention, in the sixteenth aspect of the present invention, in the upper layer formation step, baking temperature for performing baking process on the silicon dioxide film is set to 250 degrees or higher and 350 degrees or lower.

Effects of the Invention

According to the first aspect of the present invention, in a semiconductor device including a semiconductor layer made of an oxide semiconductor, the proportion of pure metal (the ratio of pure metal to all the components of the oxide semiconductor) at the interface of the semiconductor layer to the upper layer is made higher than the proportion of pure metal in the bulk of the semiconductor layer. Accordingly, pure metal and oxide are mixedly present regarding the components of the oxide semiconductor at the interface of the semiconductor layer. Since a state where pure metal and oxide are mixedly present is a stable state, separation and the like of elements constituting the oxide semiconductor is suppressed even when the interface of the semiconductor layer is exposed to etching liquid. Accordingly, the composition ratio of the components of the oxide semiconductor is stabilized. As a result, occurrence of variance in the characteristics of a plurality of thin film transistors (TFTs) is suppressed. In this manner, occurrence of variance in the characteristics of TFTs is suppressed in the semiconductor device including a semiconductor layer made of an oxide semiconductor.

According to the second aspect of the present invention, pure metal and oxide are mixedly present regarding the components of the oxide semiconductor at the peripheral edge portion of the interface of the semiconductor layer. Accordingly, occurrence of variance in the characteristics of TFTs due to exposure of the peripheral edge portion to etching liquid is suppressed.

According to the third aspect of the present invention, pure metal and oxide are mixedly present regarding the components of the oxide semiconductor at the upper surface portion of the interface of the semiconductor layer. Accordingly, occurrence of variance in the characteristics of TFTs due to exposure of the upper surface portion to etching liquid is suppressed.

According to the fourth aspect of the present invention, the proportion of pure metal is increased at the entire interface of the semiconductor layer to the upper layer. Accordingly, occurrence of variance in the characteristics of TFTs is effectively suppressed in the semiconductor device including the semiconductor layer made of the oxide semiconductor.

According to the fifth aspect of the present invention, occurrence of variance in the characteristics of TFTs is suppressed, as in the first aspect of the present invention, in the semiconductor device having the passivation film formed on the semiconductor layer.

According to the sixth aspect of the present invention, occurrence of variance in the characteristics of TFTs is suppressed, as in the first aspect of the present invention, in the semiconductor device including a TFT having a top gate structure.

According to the seventh aspect of the present invention, reduction is not greatly performed in the semiconductor layer. Accordingly, reduction in the proportion of pure metal in the semiconductor layer is suppressed.

According to the eighth aspect of the present invention, because an oxide semiconductor having characteristics that the mobility is high and the leakage current is small is used, power consumption of a display device may be greatly reduced.

According to the ninth aspect of the present invention, an increase in the resolution and miniaturization of a display device may be achieved.

According to the tenth aspect of the present invention, in a manufacturing process of the semiconductor device including the semiconductor layer made of the oxide semiconductor, after the semiconductor layer is formed, the upper layer of the semiconductor layer is deposited in such a way that the proportion of pure metal (the ratio of pure metal to all the components of the oxide semiconductor) at the interface of the semiconductor layer to the upper layer is higher than the proportion of pure metal in the bulk of the semiconductor layer. Accordingly, pure metal and oxide are mixedly present regarding the components of the oxide semiconductor at the interface of the semiconductor layer. Since a state where pure metal and oxide are mixedly present is a stable state, separation and the like of elements constituting the oxide semiconductor is suppressed even when the interface of the semiconductor layer is exposed to etching liquid. Accordingly, the composition ratio of the components of the oxide semiconductor is stabilized. As a result, occurrence of variance in the characteristics of a plurality of thin film transistors (TFTs) is suppressed. In this manner, occurrence of variance in the characteristics of TFTs is suppressed in the semiconductor device including a semiconductor layer made of an oxide semiconductor.

According to the eleventh aspect of the present invention, pure metal and oxide are mixedly present regarding the components of the oxide semiconductor at the peripheral edge portion of the interface of the semiconductor layer. Accordingly, occurrence of variance in the characteristics of TFTs due to exposure of the peripheral edge portion to etching liquid is suppressed.

According to the twelfth aspect of the present invention, pure metal and oxide are mix mixedly present regarding the components of the oxide semiconductor at the upper surface portion of the interface of the semiconductor layer. Accordingly, occurrence of variance in the characteristics of TFTs due to exposure of the upper surface portion to etching liquid is suppressed.

According to the thirteenth aspect of the present invention, the proportion of pure metal is increased at the entire interface of the semiconductor layer to the upper layer. Accordingly, occurrence of variance in the characteristics of TFTs is effectively suppressed in the semiconductor device including the semiconductor layer made of the oxide semiconductor.

According to the fourteenth aspect of the present invention, occurrence of variance in the characteristics of TFTs is suppressed, as in the tenth aspect of the present invention, in the semiconductor device having the passivation film formed on the semiconductor layer.

According to the fifteenth aspect of the present invention, occurrence of variance in the characteristics of TFTs is suppressed, as in the tenth aspect of the present invention, in the semiconductor device including a TFT having a top gate structure.

According to the sixteenth aspect of the present invention, reduction is not greatly performed in the semiconductor layer. Accordingly, reduction in the proportion of pure metal in the semiconductor layer is suppressed.

According to the seventeenth aspect of the present invention, because oxygen is appropriately supplied to the semiconductor layer, a desirable proportion of pure metal is maintained at the interface of the semiconductor layer to the upper layer.

According to the eighteenth aspect of the present invention, as in the seventeenth aspect of the present invention, a desirable proportion of pure metal is maintained at the interface of the semiconductor layer to the upper layer.

According to the nineteenth aspect of the present invention, as in the seventeenth aspect of the present invention, a desirable proportion of pure metal is maintained at the interface of the semiconductor layer to the upper layer.

MODES FOR CARRYING OUT THE INVENTION

0. Basic Study

Before describing embodiments, an outline of the present invention will be given with reference to FIGS. 2 to 6. A semiconductor device (a semiconductor substrate) according to the present invention includes a plurality of layers including a semiconductor layer. It should be noted that description is given here assuming that a gate insulating film is formed at a lower layer of the semiconductor layer and that a passivation film is formed at an upper layer of the semiconductor layer. Also, an interface (a surface forming a border) of the semiconductor layer to the passivation film is referred to as "Pas interface" for the sake of convenience.

Figure 2:
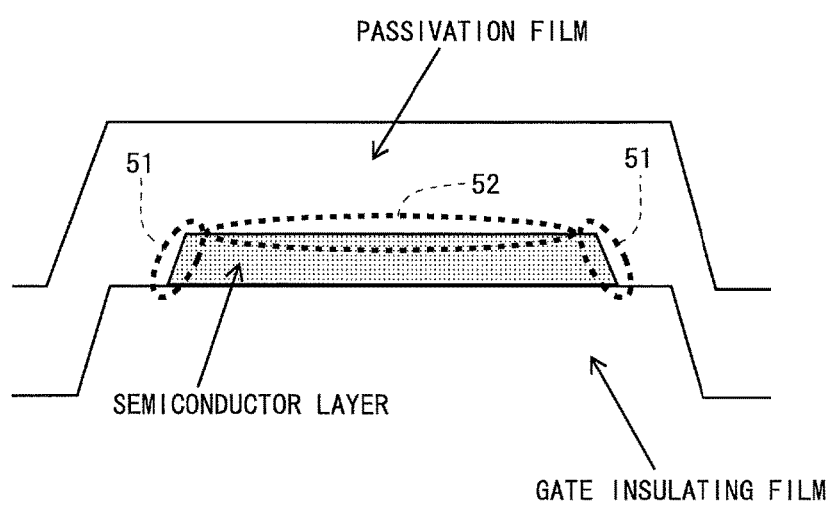
FIG. 2 is a diagram for describing a semiconductor layer.

As described above, in a manufacturing process of a TFT by photolithography, the pattern of a semiconductor layer is exposed to etching liquid at peripheral edge portions (parts indicated by reference characters 51 in FIG. 2) and an upper surface portion (a part indicated by a reference character 52 in FIG. 2). Accordingly, conventionally, the film quality is changed at the peripheral edge portions and the upper surface portion of the pattern of the semiconductor layer, and variance is caused in the TFT characteristics.

Figure 3:
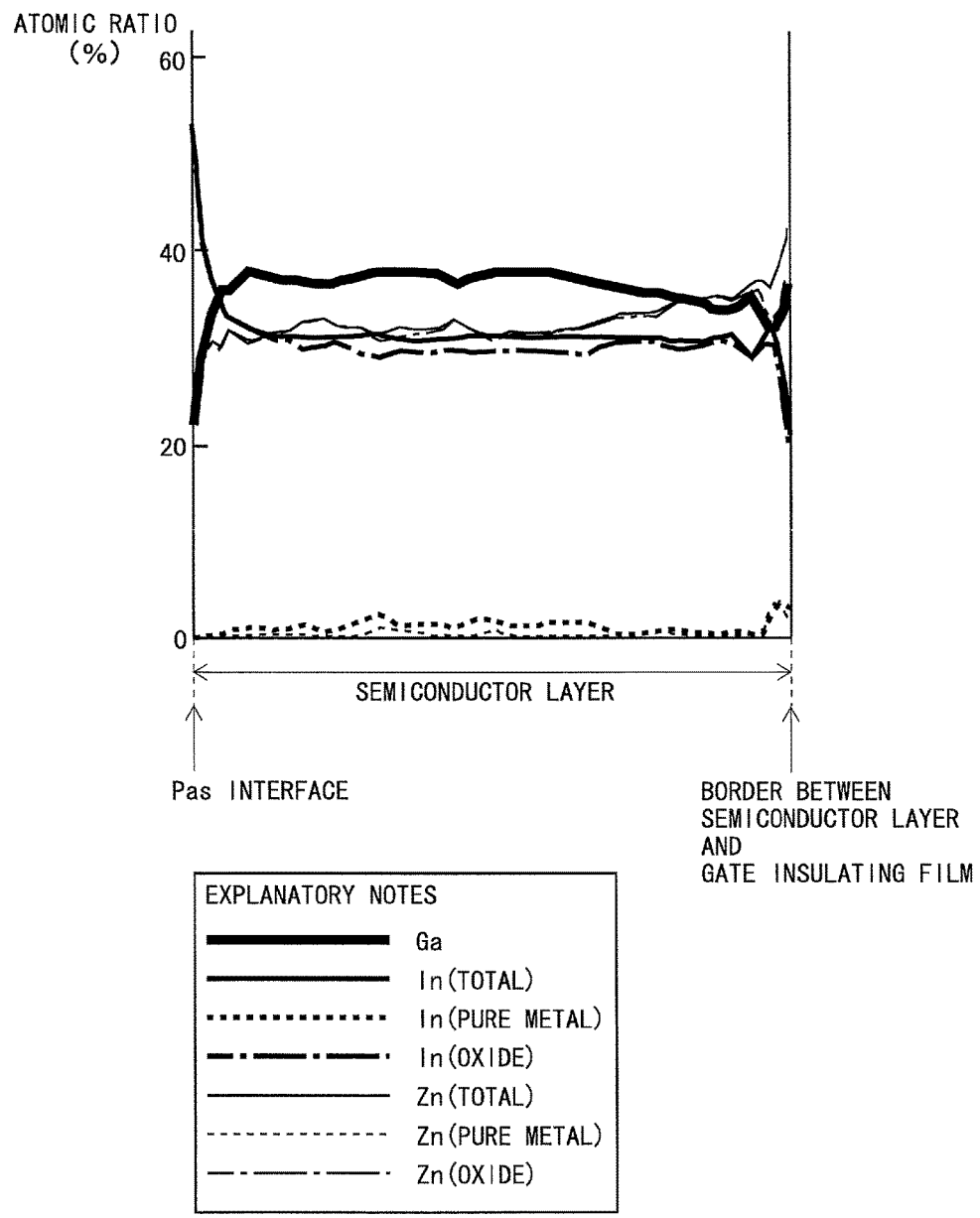
FIG. 3 is a graph showing a result of Auger analysis performed when a passivation film was deposited under a certain deposition condition (deposition condition A).
Figure 4:
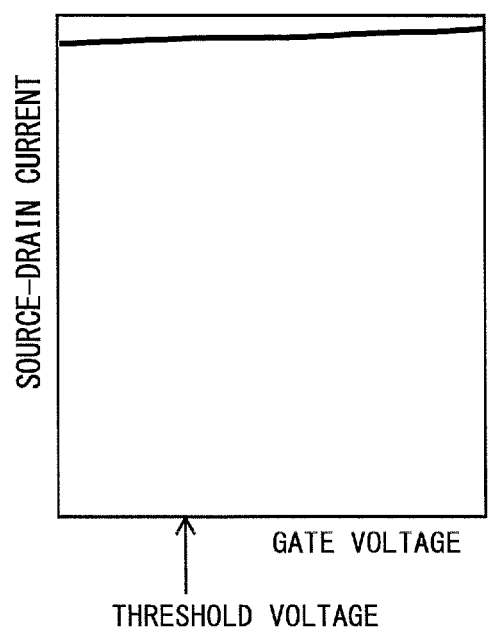
FIG. 4 is a graph showing TFT characteristics when a passivation film was deposited under the deposition condition A.
Figure 5:
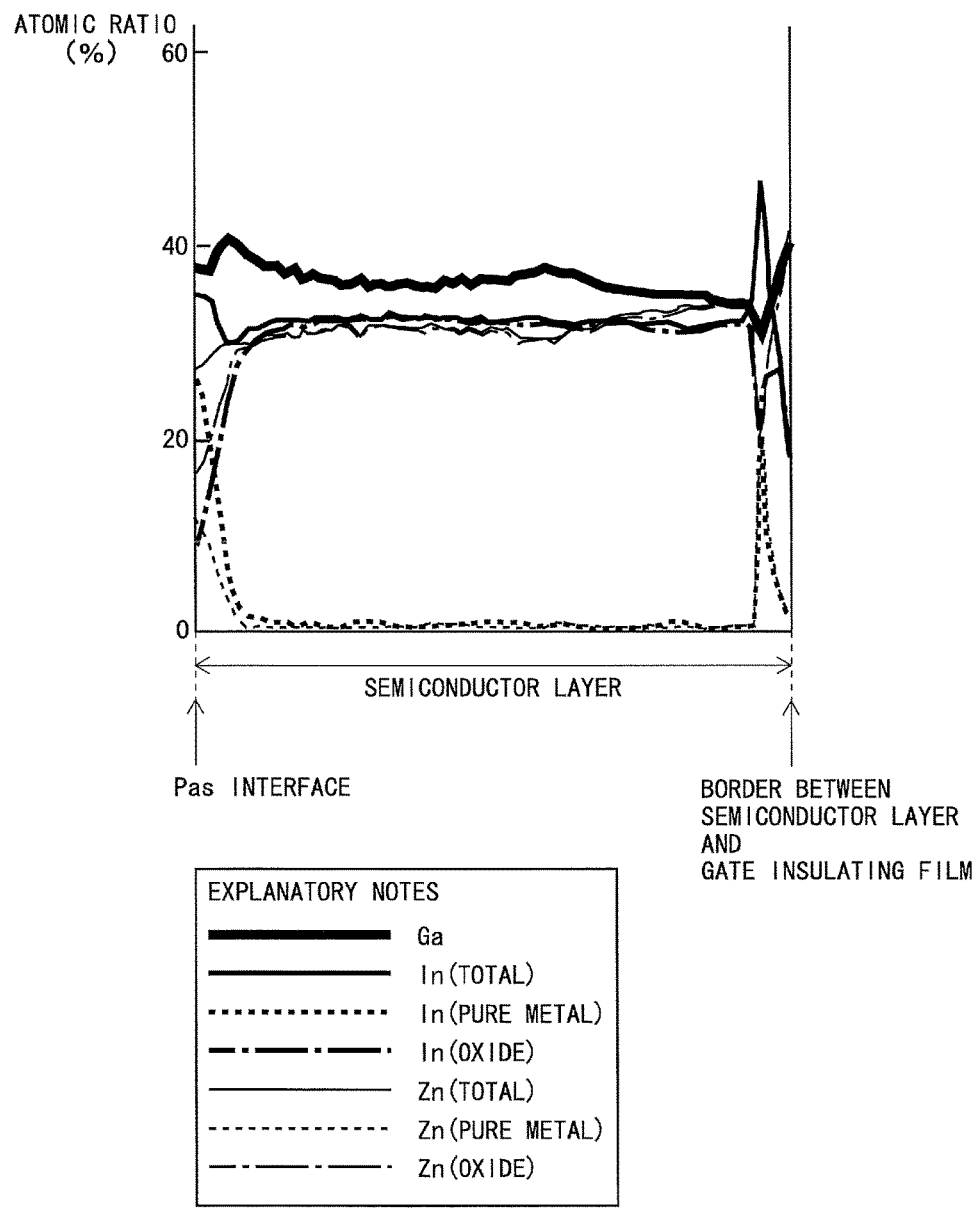
FIG. 5 is a graph showing a result of Auger analysis performed when a passivation film was deposited under a deposition condition (deposition condition B) different from the deposition condition A.
Figure 6:
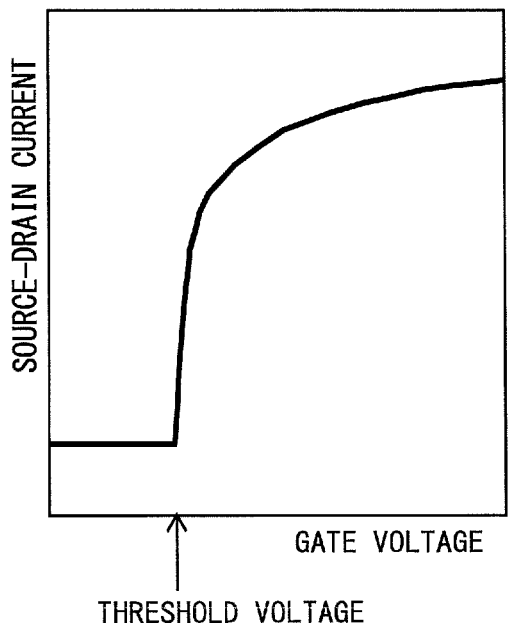
FIG. 6 is a graph showing TFT characteristics when a passivation film was deposited under the deposition condition B.

FIG. 3 is a graph showing a result of Auger analysis performed when a passivation film was deposited under a certain deposition condition (hereinafter referred to as "deposition condition A"). FIG. 4 is a graph showing TFT characteristics when a passivation film was deposited under the deposition condition A. FIG. 5 is a graph showing a result of Auger analysis performed when a passivation film was deposited under a deposition condition (hereinafter referred to as "deposition condition B") different from the deposition condition A. FIG. 6 is a graph showing TFT characteristics when a passivation film was deposited under the deposition condition B.

As can be grasped from FIG. 3, when a passivation film is deposited under the deposition condition A, In (indium) and Zn (zinc) are hardly present as pure metals near the Pas interface of the semiconductor layer, but are present as oxides. With respect to a semiconductor layer, a state where pure metal and oxide are mixedly present is considered to be a stable state. In an unstable state, elements may be partially separated. Among In, Ga (gallium) and Zn, Zn is most easily separated, and thus, in a region where there is no pure metal and which is in an unstable state, the proportion of In in all the structural elements becomes high. As a result, the TFT is conducted regardless of the level of gate voltage, as shown in FIG. 4. The TFT does not operate normally when the TFT characteristics are as shown by the graph in FIG. 4.

In contrast, when the passivation film is deposited under the deposition condition B, pure metal and oxide are mixedly present regarding In and Zn near the Pas interface of the semiconductor layer, as shown in FIG. 5. At this time, the composition ratio of In, Ga and Zn is a desirable composition ratio. Moreover, as can be grasped from FIG. 6, the TFT has normal TFT characteristics.

Accordingly, it is considered that the composition ratio of components (for example, In, Ga and Zn) of a semiconductor layer becomes stable when a certain amount of pure metal is contained in the Pas interface of the pattern of the semiconductor layer. Therefore, in the present invention, in order to stabilize the composition ratio of components of a semiconductor layer, the proportion of pure metal in the Pas interface of the semiconductor layer (the ratio of pure metal to all the components of the semiconductor layer) is increased. Specifically, the proportion of pure metal at the parts indicated by the reference characters 51 in FIG. 2, or the proportion of pure metal at the part indicated by the reference character 52 in FIG. 2, or the proportions of pure metal at the parts indicated by the reference characters 51 and the part indicated by the reference character 52 in FIG. 2 is/are made higher than the proportion of pure metal in the bulk of the semiconductor layer.

In light of the above, embodiments of the present invention will be described below with reference to the appended drawings.

1. First Embodiment

<1.1. Configuration of Semiconductor Device (Semiconductor Substrate)>

Figure 7:
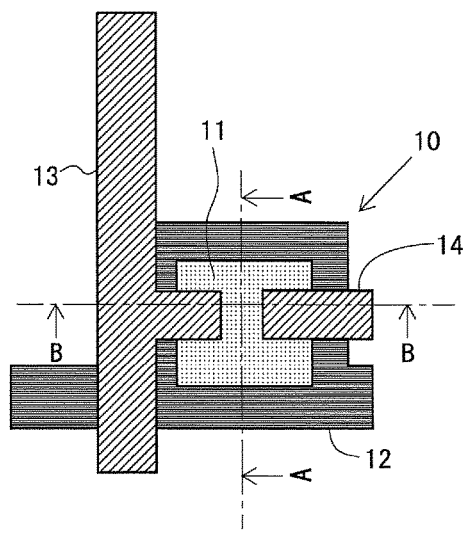
FIG. 7 is a schematic plan view of a TFT included in a semiconductor device according to a first embodiment of the present invention.

A configuration of a semiconductor device (a semiconductor substrate) according to a first embodiment of the present invention will be described. FIG. 7 is a schematic plan view (seen from above) of a TFT 10 included in a semiconductor device according to the present embodiment. It should be noted that, for the sake of convenience, FIG. 7 shows only a semiconductor layer 11, a gate electrode 12, a source electrode 13, and a drain electrode 14, among constituent elements of the TFT 10. In addition, in FIG. 7, a reference character 12 is assigned to the entire gate electrode and gate bus line (scanning signal line), and a reference character 13 is assigned to the entire source electrode and source bus line (video signal line).

As can be grasped from FIG. 7, the semiconductor layer 11 is formed on the upper layer side than the gate electrode 12, and the source electrode 13 and the drain electrode 14 are formed on the upper layer side than the semiconductor layer 11. That is, in the present embodiment, the TFT 10 has a bottom gate structure, and a top contact type (a mode in which the upper surface of the semiconductor layer 11 is in contact with the source electrode 13 and the drain electrode 14) is adopted with respect to the relationship between the semiconductor layer 11, and the source electrode 13 and the drain electrode 14.

Figure 1:
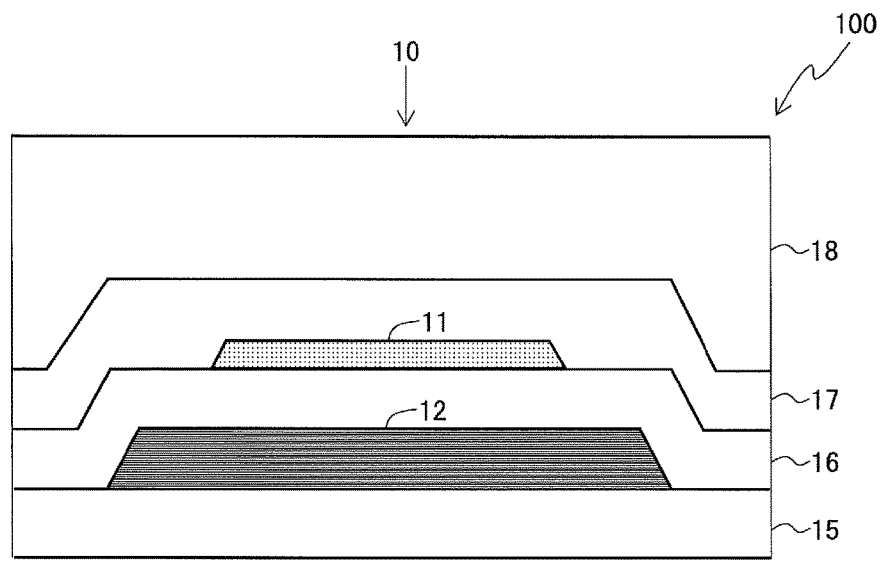
FIG. 1 is a cross-sectional view taken along line A-A in FIG. 7.
Figure 8:
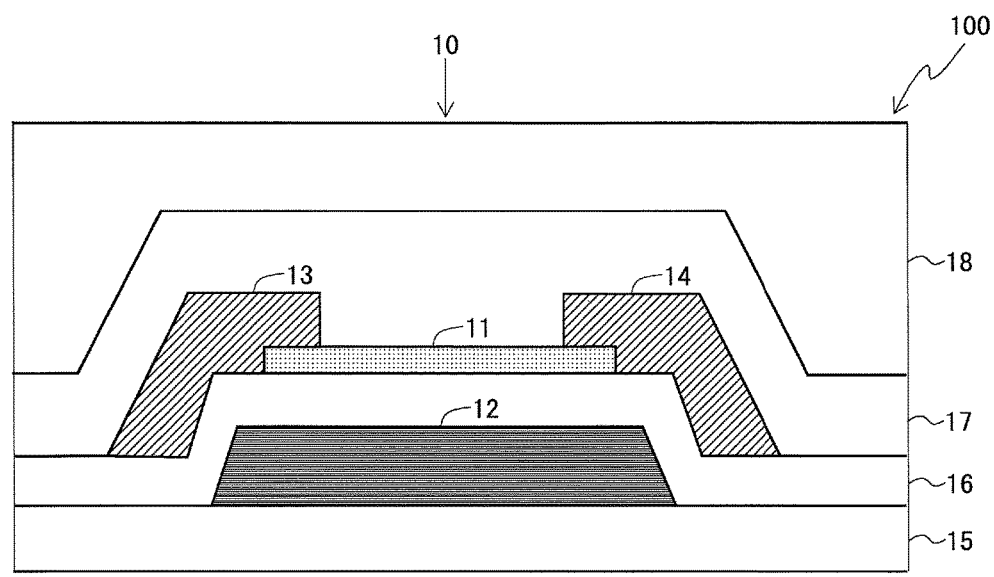
FIG. 8 is a cross-sectional view taken along line B-B in FIG. 7.

FIG. 1 is a cross-sectional view taken along line A-A in FIG. 7. FIG. 8 is a cross-sectional view taken along line B-B in FIG. 7. As shown in FIGS. 1 and 8, the TFT 10 included in a semiconductor device 100 according to the present embodiment includes a gate electrode 12 formed on a glass substrate 15, a gate insulating film 16 formed to cover the gate electrode 12, an insular semiconductor layer (a channel layer) 11 formed on the gate insulating film 16, a source electrode 13 and a drain electrode 14 formed on the gate insulating film 16 in a manner contacting the semiconductor layer 11, a passivation film 17 formed to cover the semiconductor layer 11, the source electrode 13, and the drain electrode 14, and an organic insulating film 18 formed on the passivation film 17. The semiconductor device 100 is used as a substrate of a display device such as a liquid crystal display device or an organic EL display device.

For example, the gate electrode 12 is formed from a laminated metal film stacking, in the following order, a titanium (Ti) film having a film thickness of 10 nm to 100 nm, an aluminum (Al) film having a film thickness of 50 nm to 500 nm, and a titanium film having a film thickness of 50 nm to 300 nm. Additionally, the gate electrode 12 may alternatively be formed from a laminated metal film stacking a titanium film and a copper (Cu) film in order.

For example, the gate insulating film 16 is formed from a laminated insulating film stacking a silicon dioxide ($SiO_2$) film having a film thickness of 20 nm to 100 nm on a silicon nitride (SiNx) film having a film thickness of 100 nm to 500 nm. It should be noted that, alternatively, the gate insulating film 16 may be formed from a laminated insulating film stacking a silicon nitride film and a silicon oxynitride film in order, or may be formed from a single-layer insulating film such as a silicon dioxide film.

The semiconductor layer 11 is an oxide semiconductor layer made of an oxide semiconductor. The oxide semiconductor layer is an In—Ga—Zn—O-based semiconductor layer, for example. The film thickness of the oxide semiconductor layer is about 20 nm to 200 nm, for example. The oxide semiconductor layer includes an In—Ga—Zn—O-based semiconductor, for example. The In—Ga—Zn—O-based semiconductor is a ternary oxide of indium (In), gallium (Ga), and zinc (Zn). The ratio (composition ratio) of In, Ga and Zn is not particularly specified. For example, In:Ga:Zn=2:2:1, In:Ga:Zn=1:1:1, or In:Ga:Zn=1:1:2 may be adopted.

A TFT having an In—Ga—Zn—O-based semiconductor layer has high mobility (mobility more than 20 times that of a-SiTFT) and low leakage current (leakage current less than a hundredth of that of a-SiTFT), and can be desirably used as a drive TFT and a pixel TFT. The power consumption of a display device can be greatly reduced by using the TFT having an In—Ga—Zn—O-based semiconductor layer.

The In—Ga—Zn—O-based semiconductor may be amorphous, or may be crystalline including a crystalline portion. As a crystalline In—Ga—Zn—O-based semiconductor, a crystalline In—Ga—Zn—O-based semiconductor having c-axis oriented approximately perpendicularly to the layer surface is desirable. The crystal structure of such an In—Ga—Zn—O-based semiconductor is disclosed in Japanese Laid-Open Patent Publication No. 2012-134475, for example.

The oxide semiconductor layer may include another oxide semiconductor instead of the In—Ga—Zn—O-based semiconductor. For example, a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, a CdO (cadmium oxide), an Mg—Zn—O-based semiconductor, an In—Sn—Zn—O-based semiconductor (such as $In_2O_3$—$SnO_2$—ZnO), or an In—Ga—Sn—O-based semiconductor may be included.

Figure 9:
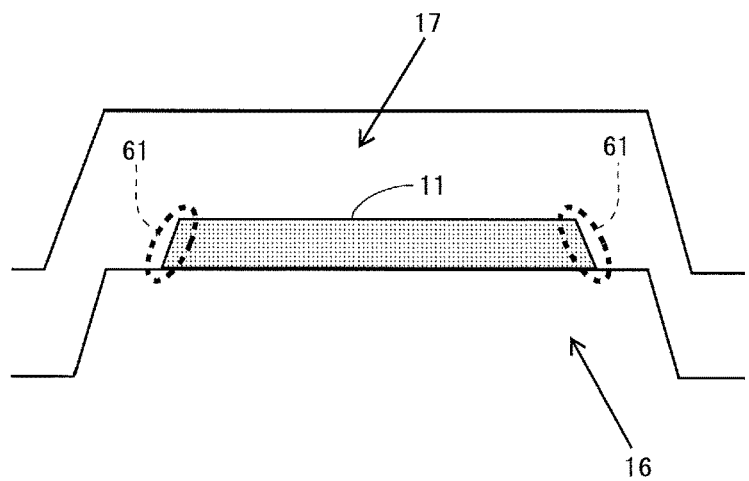
FIG. 9 is a diagram for describing the proportion of pure metal in a semiconductor layer according to the first embodiment.

In the present embodiment, the proportion of pure metal (the ratio of pure metal to all the structural components of the semiconductor layer 11) at peripheral edge portions (parts indicated by reference characters 61 in FIG. 9) of the pattern of the semiconductor layer 11 is higher than the proportion of pure metal in the bulk of the semiconductor layer 11. That is, when the proportion of pure metal at the peripheral edge portions of the pattern of the semiconductor layer 11 is given as "R1" and the proportion of pure metal in the bulk of the semiconductor layer 11 is given as "R2", R1 is greater than R2.

The source electrode 13 and the drain electrode 14 are disposed on the upper surface of the semiconductor layer 11 with a predetermined distance in-between. As shown in FIG. 8, the source electrode 13 and the drain electrode 14 extend onto the gate insulating film 16. The source electrode 13 and the drain electrode 14 are formed from a laminated metal film stacking, in the following order, a titanium film having a film thickness of 10 nm to 100 nm, an aluminum film having a film thickness of 50 nm to 400 nm, and a titanium film having a film thickness of 50 nm to 300 nm, for example. It should be noted that, alternatively, the source electrode 13 and the drain electrode 14 may be formed from a single-layer metal film of titanium, aluminum, copper, tungsten (W), molybdenum (Mo), tantalum or the like. Moreover, the source electrode 13 and the drain electrode 14 may be formed from a single-layer alloy film of aluminum-neodymium (Nd), titanium-aluminum, molybdenum-tungsten, indium-tin or the like. Furthermore, the source electrode 13 and the drain electrode 14 may be formed from a laminated metal film stacking a copper film on a titanium film, a laminated metal film stacking an aluminum film on a titanium film, a laminated metal film stacking a molybdenum film on a titanium film, or the like.

The passivation film 17 is formed to cover the semiconductor layer 11, the source electrode 13, and the drain electrode 14. For example, the passivation film 17 is formed from a silicon dioxide film having a film thickness of 50 nm to 500 nm. The organic insulating film 18 is a flattening film formed on the upper surface of the passivation film 17. For example, the organic insulating film 18 is formed from an acrylic-based resin film having a film thickness of 1 μm to 4 μm.

<1.2. Manufacturing Method>

Figure 10:
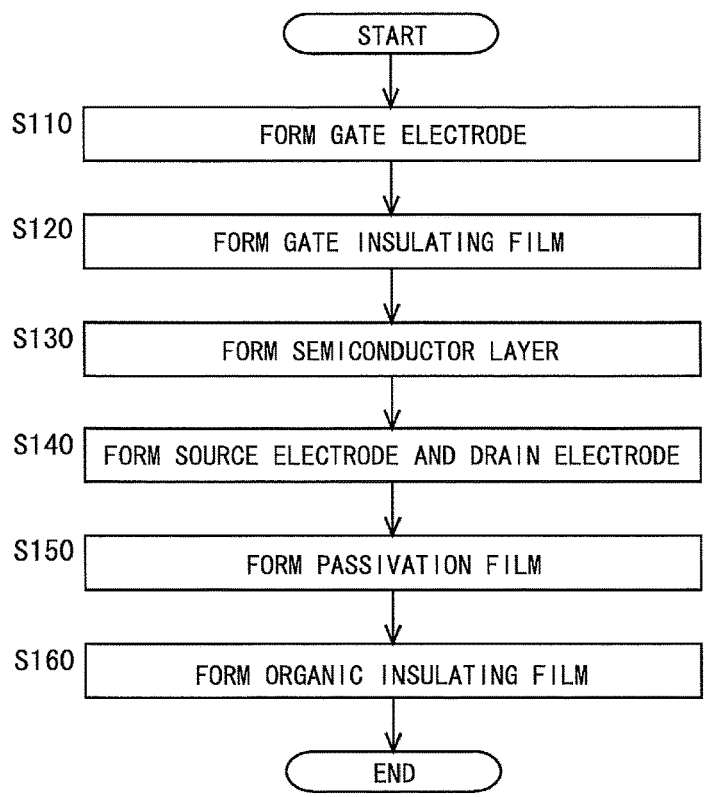
FIG. 10 is a flowchart for describing a method for manufacturing the semiconductor device according to the first embodiment.

A method for manufacturing the semiconductor device 100 of the present embodiment will be described with reference to FIG. 10. First, a laminated metal film is formed on the glass substrate 15 by sequentially depositing a titanium film, an aluminum film, and a titanium film, in this order, by using sputtering method, for example. Next, a resist pattern is formed on the surface of the laminated metal film by using photolithography. The laminated metal film is etched by dry etching method by using the resist pattern as a mask. The gate electrode 12 is formed in the above manner (step S110). It should be noted that a gate bus line, an auxiliary capacitance electrode, a lower wiring and the like are also formed in step S110.

Next, a silicon nitride film and a silicon dioxide film are sequentially deposited to cover the entire glass substrate 15 including the gate electrode 12, by using a plasma chemical vapor deposition method (hereinafter referred to as "plasma CVD method"), and the gate insulating film 16 is thereby formed (step S120). The gate electrode 12 is thus covered by the gate insulating film 16.

Next, an oxide semiconductor film containing indium, gallium, zinc, and oxygen is deposited on the surface of the gate insulating film 16 by using DC (direct current) sputtering method. The oxide semiconductor film is formed by DC sputtering method by using a target obtained by mixing indium oxide ($In_2O_3$), gallium oxide ($Ga_2O_3$), and zinc oxide (ZnO) in an equimolar ratio and sintering them. Next, a resist pattern is formed on the surface of the oxide semiconductor film, and the oxide semiconductor film is etched by wet etching method by using the resist pattern as a mask. The insular semiconductor layer (channel layer) 11 is thereby formed (step S130).

Next, a laminated metal film is formed by sequentially depositing a titanium film, an aluminum film, and a titanium film in this order by sputtering method, for example. Then, a resist pattern is formed on the surface of the laminated metal film by photolithography method. The laminated metal film is etched by dry etching method by using the resist pattern as a mask. The source electrode 13 and the drain electrode 14 are formed in the above manner (step S140). It should be noted that a source bus line and the like are also formed in step S140.

Next, the passivation film 17 is deposited, by the plasma CVD method, to cover the entire glass substrate 15 including the source electrode 13 and the drain electrode 14 (step S150). In step S150, deposition conditions of the passivation film 17 are set such that the proportion of pure metal at the peripheral edge portions, of the pattern of the semiconductor layer 11, of the Pas interface described above becomes higher than the proportion of pure metal in the bulk of the semiconductor layer 11. Specifically, deposition conditions are optimized by adjusting deposition temperature, deposition power, baking temperature and the like. It should be noted that an upper limit value for the proportion of pure metal at the peripheral edge portions of the pattern of the semiconductor layer 11 is determined so that pure metal does not fill between channels. Also, in the case where the passivation film 17 is formed from a silicon dioxide film, reduction is not greatly performed in the semiconductor layer 11. Accordingly, the region between the channels is not made entirely pure metal.

Next, for example, an acrylic-based resin is deposited on the passivation film 17 by spin-coating method, and the organic insulating film 18 is thereby formed (step S160).

It should be noted that, in the present embodiment, a semiconductor layer formation step is realized by step S130, and an upper layer formation step is realized by step S150.

<1.3. Specific Examples of Deposition Conditions>

Three specific examples will be described with respect to the deposition conditions of the passivation film 17. It should be noted that the present invention is not limited to the three specific examples below, and the proportion of pure metal at a peripheral edge portion of the pattern of the semiconductor layer 11 may be made higher than the proportion of pure metal in the bulk of the semiconductor layer 11 under other deposition conditions.

First Example

The deposition temperature for depositing the passivation film 17 is set to 150 degrees or higher and 250 degrees or lower. It should be noted that a silicon dioxide ($SiO_2$) film is assumed to be used as the passivation film 17. When the semiconductor layer 11 is placed in an oxygen defect state, carrier electrons are generated and resistance of the semiconductor layer 11 is reduced, and thus, leakage current of the TFT 10 is increased. With respect to this point, by performing deposition of the passivation film 17 by setting the deposition temperature to 150 degrees or higher and 250 degrees or lower as described above, oxygen is appropriately supplied to the semiconductor layer 11. Therefore, a desirable proportion of pure metal is maintained at the Pas interface. If the deposition temperature is set to 250 degrees or higher, oxygen is redundantly supplied to the semiconductor layer 11, and although film defects in the semiconductor layer 11 are reduced, metal elements are oxidized and the proportion of pure metal in the Pas interface is reduced. Also, if the deposition temperature is set to 150 degrees or lower, denseness of the film of the semiconductor layer 11 is impaired. A TFT not having normal TFT characteristics or a TFT which is not sufficiently reliable is thereby manufactured.

Second Example

The deposition power for depositing the passivation film 17 is set to at least 800 W. It should be noted that a silicon dioxide ($SiO_2$) film is assumed to be used as the passivation film 17, and the substrate size is assumed to be 620 mm×750 mm. Also in the second example, as in the first example, oxygen is appropriately supplied to the semiconductor layer 11, and a desirable proportion of pure metal is maintained at the Pas interface.

Third Example

The baking temperature for performing baking process on the passivation film 17 is set to 250 degrees or higher and 350 degrees or lower. It should be noted that a silicon dioxide ($SiO_2$) film is assumed to be used as the passivation film 17. By setting the baking temperature to 250 degrees or higher and 350 degrees or lower, oxygen is appropriately supplied to the semiconductor layer 11, and a desirable proportion of pure metal is maintained at the Pas interface. If the baking temperature is set to 350 degrees or higher, oxygen is redundantly supplied to the semiconductor layer 11, and although film defects in the semiconductor layer 11 are reduced, metal elements are oxidized and the proportion of pure metal in the Pas interface is reduced. Also, if the baking temperature is set to 250 degrees or lower, denseness of the film of the semiconductor layer 11 is impaired. A TFT not having normal TFT characteristics or a TFT which is not sufficiently reliable is thereby manufactured.

<1.4. Effects>

According to the present embodiment, at the time of deposition of the passivation film 17, which is an upper layer of the semiconductor layer 11, deposition conditions of the passivation film 17 are set such that the proportion of pure metal at the peripheral edge portions of the pattern of the semiconductor layer 11 becomes higher than the proportion of pure metal in the bulk of the semiconductor layer 11. Accordingly, after the passivation film 17 is formed, pure metal and oxide are mixedly present regarding the components of the oxide semiconductor at the peripheral edge portions of the pattern of the semiconductor layer 11. Since a state where pure metal and oxide are mixedly present is a stable state, separation of elements such as Zn is suppressed even when the peripheral edge portions of the pattern of the semiconductor layer 11 are exposed to etching liquid. Accordingly, the composition ratio of the components of the oxide semiconductor is stabilized. As a result, occurrence of variance in the characteristics of the TFTs 10 (for example, variance in the threshold voltage) is suppressed. As described above, according to the present embodiment, occurrence of variance in the characteristics of the TFTs 10 is suppressed in the semiconductor device 100 including the semiconductor layer 11 made of an oxide semiconductor.

Moreover, the oxide semiconductor has characteristics that the mobility is high and the leakage current is small. Accordingly, using this semiconductor device 100 as a substrate enables the power consumption of a display device to be greatly reduced. Moreover, adopting a crystalline In—Ga—Zn—O-based semiconductor allows an increase in the resolution and miniaturization of a display device.

<1.5. Variants>

In the first embodiment described above, the proportion of pure metal at the peripheral edge portions of the pattern of the semiconductor layer 11 is higher than the proportion of pure metal in the bulk of the semiconductor layer 11. However, the present invention is not limited to such a case. In the following, variants will be described with respect to a part where the proportion of pure metal is to be increased.

<1.5.1. First Variant>

Figure 11:
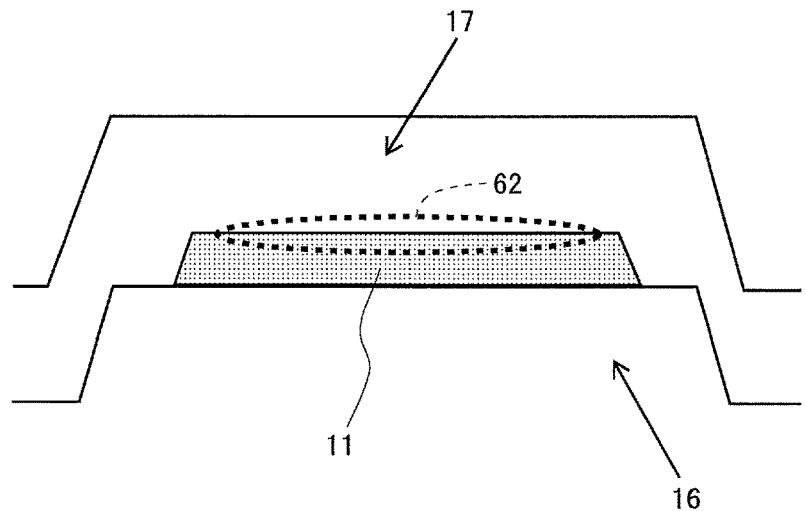
FIG. 11 is a diagram for describing the proportion of pure metal in a semiconductor layer according to a first variant of the first embodiment.

FIG. 11 is a diagram for describing the proportion of pure metal in a semiconductor layer 11 according to a first variant of the first embodiment described above. In the present variant, at the time of deposition of a passivation film 17, the deposition conditions of the passivation film 17 are set such that the proportion of pure metal at an upper surface portion (a part indicated by a reference character 62 in FIG. 11) of a pattern of the semiconductor layer 11 becomes higher than the proportion of pure metal in the bulk of the semiconductor layer 11. Accordingly, after the passivation film 17 is formed, the proportion of pure metal is high at the upper surface portion of the pattern of the semiconductor layer 11. Therefore, even when the upper surface portion of the pattern of the semiconductor layer 11 is exposed to etching liquid, occurrence of variance in the composition ratio of components of the oxide semiconductor is suppressed at the upper surface portion. As a result, occurrence of variance in the characteristics of TFTs 10 is suppressed.

<1.5.2. Second Variant>

Figure 12:
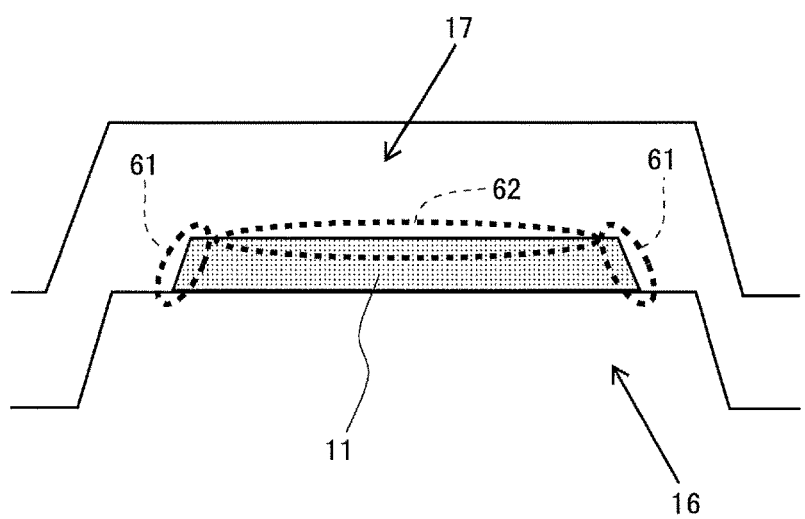
FIG. 12 is a diagram for describing the proportion of pure metal in a semiconductor layer according to a second variant of the first embodiment.

FIG. 12 is a diagram for describing the proportion of pure metal in a semiconductor layer 11 according to a second variant of the first embodiment described above. In the present variant, at the time of deposition of a passivation film 17, the deposition conditions of the passivation film 17 are set such that the proportions of pure metal at peripheral edge portions (parts indicated by reference characters 61 in FIG. 12) and an upper surface portion (a part indicated by a reference character 62 in FIG. 12) of the pattern of a semiconductor layer 11 become higher than the proportion of pure metal in the bulk of the semiconductor layer 11. Accordingly, after the passivation film 17 is formed, the proportions of pure metal are high at the peripheral edge portions and the upper surface portion of the pattern of the semiconductor layer 11. Therefore, even when the peripheral edge portions and the upper surface portion of the pattern of the semiconductor layer 11 are exposed to etching liquid, occurrence of variance in the composition ratio of components of the oxide semiconductor is suppressed at the peripheral edge portions and the upper surface portion. Occurrence of variance in the composition ratio of components of the oxide semiconductor is thus suppressed at the entire Pas interface described above, and occurrence of variance in the characteristics of TFTs 10 is thereby suppressed effectively.

2. Second Embodiment

<2.1. Configuration of Semiconductor Device (Semiconductor Substrate)>

Figure 13:
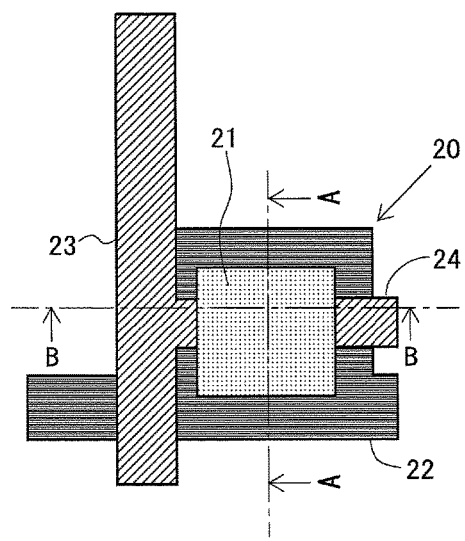
FIG. 13 is a schematic plan view of a TFT included in a semiconductor device according to a second embodiment of the present invention.

A configuration of a semiconductor device (a semiconductor substrate) according to a second embodiment of the present invention will be described. Note that the same points as those in the first embodiment described above will be omitted from the description. FIG. 13 is a schematic plan view (seen from above) of a TFT 20 included in a semiconductor device according to the present embodiment. As can be grasped from FIG. 13, a semiconductor layer 21 is formed on the upper layer side than a gate electrode 22, and a source electrode 23 and a drain electrode 24 are formed on the lower layer side than the semiconductor layer 21. That is, in the present embodiment, the TFT 20 has a bottom gate structure, and a bottom contact type (a mode in which the lower surface of the semiconductor layer 21 is in contact with the source electrode 23 and the drain electrode 24) is adopted with respect to the relationship between the semiconductor layer 21, and the source electrode 23 and the drain electrode 24.

Figure 14:
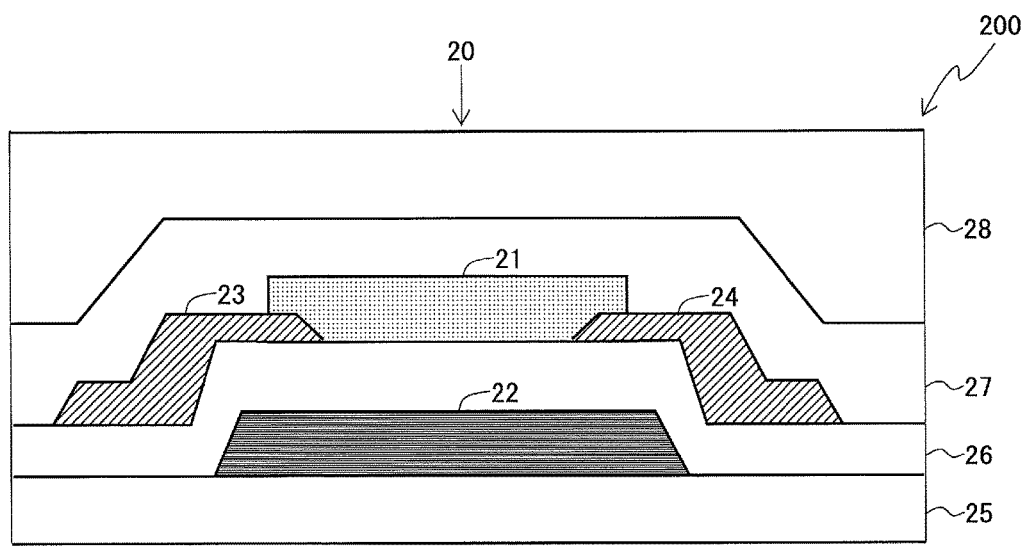
FIG. 14 is a cross-sectional view taken along line B-B in FIG. 13.

FIG. 14 is a cross-sectional view taken along line B-B in FIG. 13. The cross-sectional view along line A-A in FIG. 13 is as shown in FIG. 1. As shown in FIGS. 1 and 14, the TFT 20 included in a semiconductor device 200 according to the present embodiment includes a gate electrode 22 formed on a glass substrate 25, a gate insulating film 26 formed to cover the gate electrode 22, a source electrode 23 and a drain electrode 24 formed on the gate insulating film 26, an insular semiconductor layer (channel layer) 21 formed on the gate insulating film 26 in a manner contacting the source electrode 23 and the drain electrode 24, a passivation film 27 formed to cover the semiconductor layer 21, the source electrode 23, and the drain electrode 24, and an organic insulating film 28 formed on the passivation film 27. Note that configurations of the gate electrode 22, the gate insulating film 26, the source electrode 23, the drain electrode 24, the semiconductor layer 21, the passivation film 27, and the organic insulating film 28 are the same as those in the first embodiment.

Also in the present embodiment, the proportion of pure metal at peripheral edge portions of the pattern of the semiconductor layer 21 is higher than the proportion of pure metal in the bulk of the semiconductor layer 21. It should be noted that, as in the first variant of the first embodiment described above, the proportion of pure metal at an upper surface portion of the pattern of the semiconductor layer 21 may be made higher than the proportion of pure metal in the bulk of the semiconductor layer 21. Also, as in the second variant of the first embodiment described above, the proportions of pure metal at both the peripheral edge portions and the upper surface portion of the pattern of the semiconductor layer 21 may be made higher than the proportion of pure metal in the bulk of the semiconductor layer 21.

<2.2. Manufacturing Method>

Figure 15:
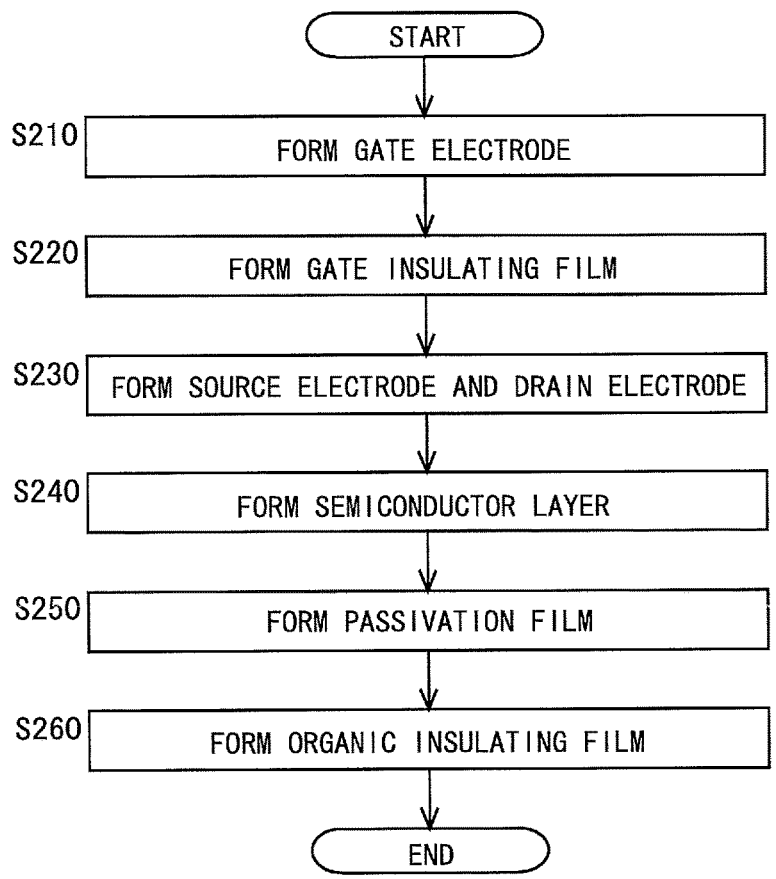
FIG. 15 is a flowchart for describing a method for manufacturing the semiconductor device according to the second embodiment.

A method for manufacturing the semiconductor device 200 of the present embodiment will be described with reference to FIG. 15. It should be noted that step S210, step S220, step S250, and step S260 in FIG. 15 correspond to step S110, step S120, step S150, and step S160 in FIG. 10, respectively. In the present embodiment, after a gate insulating film is formed (step S220), the source electrode 23 and the drain electrode 24 are formed (step S230). Then, after the source electrode 23 and the drain electrode 24 are formed, the semiconductor layer (channel layer) 21 is formed (step S240). It should be noted that, in the present embodiment, a semiconductor layer formation step is realized by step S240, and an upper layer formation step is realized by step S250.

Also in the present embodiment, when the passivation film 27 is formed (step S250), the deposition conditions of the passivation film 27 are set such that the proportion of pure metal at the peripheral edge portions, of the pattern of the semiconductor layer 21, of the Pas interface described above becomes higher than the proportion of pure metal in the bulk of the semiconductor layer 21.

<2.3. Effects>

According to the present embodiment, as in the first embodiment described above, occurrence of variance in the characteristics of the TFTs 20 is suppressed in the semiconductor device 200 including the semiconductor layer 21 made of an oxide semiconductor and adopting a bottom contact type with respect to the relationship between the semiconductor layer 21, and the source electrode 23 and the drain electrode 24.

3. Third Embodiment

<3.1. Configuration of Semiconductor Device (Semiconductor Substrate)>

Figure 16:
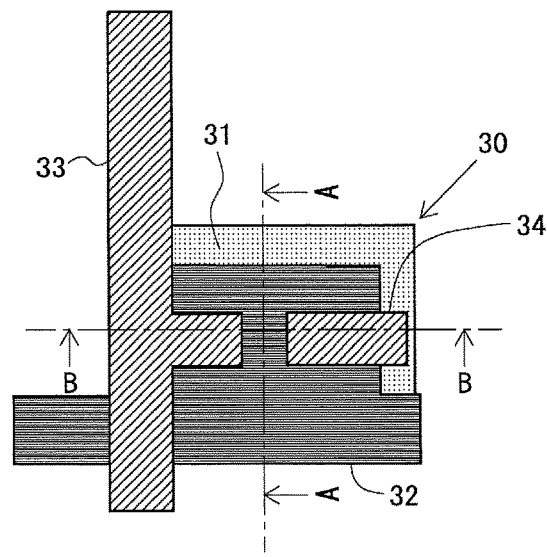
FIG. 16 is a schematic plan view of a TFT included in a semiconductor device according to a third embodiment of the present invention.

A configuration of a semiconductor device (a semiconductor substrate) according to a third embodiment of the present invention will be described. Note that the same points as those in the first embodiment described above will be omitted from the description. FIG. 16 is a schematic plan view (seen from above) of a TFT 30 included in a semiconductor device according to the present embodiment. As can be grasped from FIG. 16, a gate electrode 32 is formed on the upper layer side than a semiconductor layer 31. That is, in the present embodiment, the TFT 30 has a top gate structure. Also, a source electrode 33 and a drain electrode 34 are formed on the upper layer side than the gate electrode 32.

Figure 17:
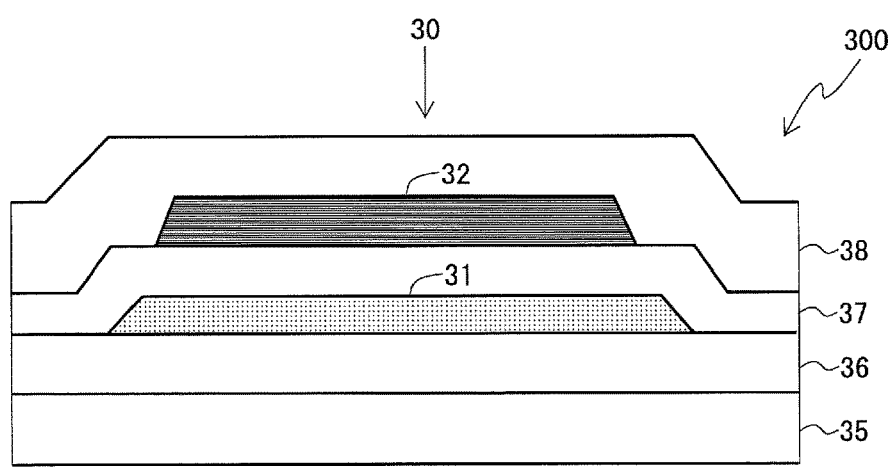
FIG. 17 is a cross-sectional view taken along line A-A in FIG. 16.
Figure 18:
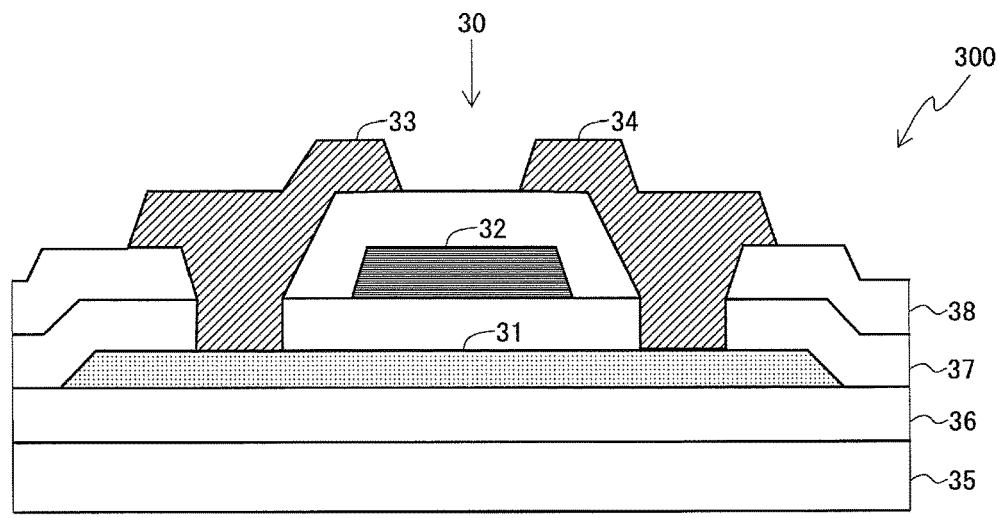
FIG. 18 is a cross-sectional view taken along line B-B in FIG. 16.

FIG. 17 is a cross-sectional view taken along line A-A in FIG. 16. FIG. 18 is a cross-sectional view taken along line B-B in FIG. 16. As shown in FIGS. 17 and 18, the TFT 30 included in a semiconductor device 300 according to the present embodiment includes a first insulating film 36 formed on a glass substrate 35, an insular semiconductor layer (channel layer) 31 formed on the first insulating film 36, a second insulating film 37 formed on the semiconductor layer 31, a gate electrode 32 formed on the second insulating film 37, a third insulating film 38 formed to cover the gate electrode 32, a source electrode 33 and a drain electrode 34 formed on the semiconductor layer 31.

The semiconductor layer 31 is an oxide semiconductor layer, and is configured in the same manner as in the first embodiment described above. Configurations of the gate electrode 32, the source electrode 33, and the drain electrode 34 are the same as those in the first embodiment.

The first insulating film 36 is formed from a silicon dioxide ($SiO_2$) film having a film thickness of about 100 nm, for example. The second insulating film 37 is formed from a silicon dioxide ($SiO_2$) film having a film thickness of about 250 nm, for example. The third insulating film 38 is formed from a silicon dioxide ($SiO_2$) film having a film thickness of about 1000 nm, for example. It should be noted that the first insulating film 36, the second insulating film 37, and the third insulating film 38 may be formed from a silicon nitride (SiNx) film, or from a laminated insulating film stacking a silicon nitride film and a silicon dioxide film in this order.

In the present embodiment, the proportion of pure metal is increased at the interface of the semiconductor layer 31 to the second insulating film 37 (hereinafter, such an interface will be referred to as "second insulating film interface" for the sake of convenience). More specifically, the proportion of pure metal at peripheral edge portions, of the pattern of the semiconductor layer 31, of the second insulating film interface is made higher than the proportion of pure metal in the bulk of the semiconductor layer 31. It should be noted that, as in the first variant of the first embodiment described above, the proportion of pure metal at an upper surface portion of the pattern of the semiconductor layer 31 may be made higher than the proportion of pure metal in the bulk of the semiconductor layer 31. Also, as in the second variant of the first embodiment described above, the proportions of pure metal at both the peripheral edge portions and the upper surface portion of the pattern of the semiconductor layer 31 may be made higher than the proportion of pure metal in the bulk of the semiconductor layer 31.

<3.2 Manufacturing Method>

Figure 19:
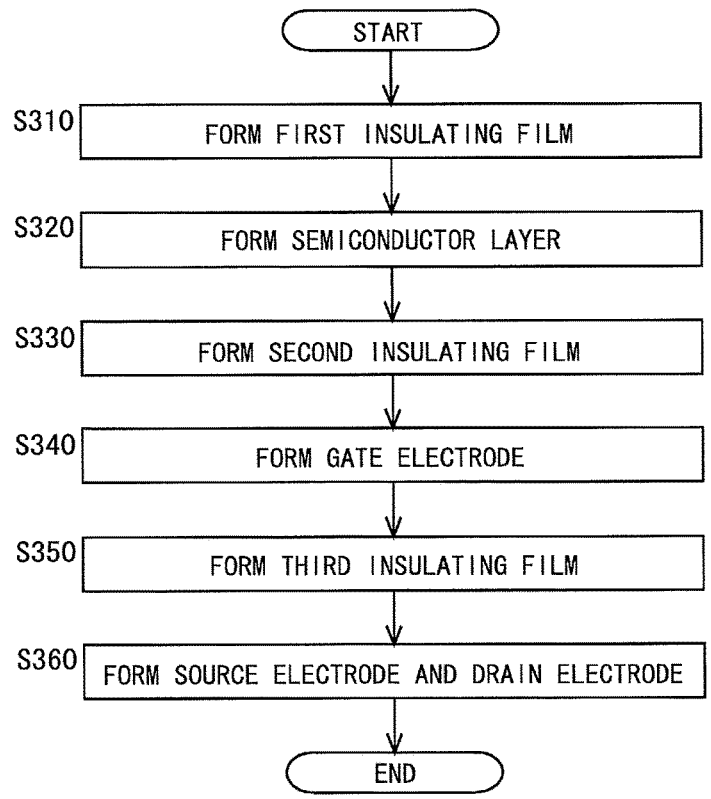
FIG. 19 is a flowchart for describing a method for manufacturing the semiconductor device according to the third embodiment.

A method for manufacturing the semiconductor device 300 of the present embodiment will be described with reference to FIG. 19. First, the first insulating film 36 is formed by depositing a silicon dioxide film on the glass substrate 35 by using the plasma CVD method (step S310).

Next, an oxide semiconductor film containing indium, gallium, zinc, and oxygen is deposited on the surface of the first insulating film 36 by using DC sputtering method. The oxide semiconductor film is formed by DC sputtering method by using a target obtained by mixing indium oxide ($In_2O_3$), gallium oxide ($Ga_2O_3$), and zinc oxide (ZnO) in an equimolar ratio and sintering them. Next, a resist pattern is formed on the surface of the oxide semiconductor film, and the oxide semiconductor film is etched by wet etching method by using the resist pattern as a mask. The insular semiconductor layer (channel layer) 31 is thereby formed (step S320).

Next, the second insulating film 37 is formed, by using the plasma CVD method, to cover the semiconductor layer 31 (step S330). In step S330, deposition conditions of the second insulating film 37 are set such that the proportion of pure metal at the peripheral edge portions, of the pattern of the semiconductor layer 31, of the second insulating film interface described above becomes higher than the proportion of pure metal in the bulk of the semiconductor layer 31. Specifically, deposition conditions are optimized by adjusting deposition temperature, deposition power, baking temperature and the like.

Next, a laminated metal film is formed on the second insulating film 37 by sequentially depositing a titanium film, an aluminum film, and a titanium film in this order by using sputtering method, for example. Then, a resist pattern is formed on the surface of the laminated metal film by using photolithography method. The laminated metal film is etched by dry etching method by using the resist pattern as a mask. The gate electrode 32 is formed in the above manner (step S340). It should be noted that a gate bus line, an auxiliary capacitance electrode, a lower wiring and the like are also formed in step S340.

Next, the third insulating film 38 is formed by the plasma CVD method or by sputtering method (step S350). Then, a contact hole is formed to the second insulating film 37 and the third insulating film 38 on the oxide semiconductor layer 31.

Next, a laminated metal film is formed by sequentially depositing a titanium film, an aluminum film, and a titanium film in this order by using sputtering method, for example. Then, a resist pattern is formed on the surface of the laminated metal film by using photolithography method. The laminated metal film is etched by dry etching method by using the resist pattern as a mask. The source electrode 33 and the drain electrode 34 are formed in the above manner (step S360). It should be noted that a source bus line and the like are also formed in step S360.

<3.3. Effects>

According to the present embodiment, as in the first embodiment described above, occurrence of variance in the characteristics of the TFTs 30 is suppressed in the semiconductor device 300 including the TFT 30 having a top gate structure, the TFT 30 including the semiconductor layer 31 made of an oxide semiconductor.

<4. Others>

The present invention is not limited to the embodiments described above, and various modifications may be made within the scope of the present invention. For example, the layer structure of the semiconductor device may be a structure other than those indicated in the embodiments described above.

DESCRIPTION OF REFERENCE CHARACTERS

- 10, 20, 30: TFT (THIN FILM TRANSISTOR)
- 11, 21, 31: SEMICONDUCTOR LAYER
- 12, 22, 32: GATE ELECTRODE
- 13, 23, 33: SOURCE ELECTRODE
- 14, 24, 34: DRAIN ELECTRODE
- 15, 25, 35: GLASS SUBSTRATE
- 16, 26: GATE INSULATING FILM
- 17, 27: PASSIVATION FILM
- 18, 28: ORGANIC INSULATING FILM
- 36: FIRST INSULATING FILM
- 37: SECOND INSULATING FILM
- 38: THIRD INSULATING FILM
- 100, 200, 300: SEMICONDUCTOR DEVICE (SEMICONDUCTOR SUBSTRATE)

The invention claimed is:

1. A method for manufacturing a semiconductor device where a plurality of layers including a semiconductor layer made of an oxide semiconductor are stacked so as to form a thin film transistor, the method comprising:
    a semiconductor layer formation step of forming the semiconductor layer; and
    an upper layer formation step of forming an upper layer of the semiconductor layer,
    wherein, in the upper layer formation step, the upper layer is deposited in such a way that, in the semiconductor layer, a proportion of pure metal indicating a ratio of pure metal to all components of the oxide semiconductor is higher at an interface of the semiconductor layer to the upper layer than in a bulk.

2. The method for manufacturing according to claim 1, wherein, in the upper layer formation step, the upper layer is deposited in such a way that the proportion of pure metal at a peripheral edge portion, of a pattern of the semiconductor layer, of the interface is higher than the proportion of pure metal in the bulk.

3. The method for manufacturing according to claim 1, wherein, in the upper layer formation step, the upper layer is deposited in such a way that the proportion of pure metal at an upper surface portion, of a pattern of the semiconductor layer, of the interface is higher than the proportion of pure metal in the bulk.

4. The method for manufacturing according to claim 1, wherein, in the upper layer formation step, the upper layer is deposited in such a way that both the proportion of pure metal at a peripheral edge portion, of a pattern of the semiconductor layer, of the interface and the proportion of pure metal at an upper surface portion, of the pattern of the semiconductor layer, of the interface are higher than the proportion of pure metal in the bulk.

5. The method for manufacturing according to claim 1, wherein, in the upper layer formation step, a passivation film is formed as the upper layer of the semiconductor layer.

6. The method for manufacturing according to claim 1, wherein, in the upper layer formation step, an insulating film for insulating a gate electrode of the thin film transistor and the semiconductor layer from each other is formed as the upper layer of the semiconductor layer.

7. The method for manufacturing according to claim 1, wherein the upper layer of the semiconductor layer is formed from a silicon dioxide film.

8. The method for manufacturing according to claim 7, wherein, in the upper layer formation step, deposition temperature for depositing the silicon dioxide film is set to 150 degrees or higher and 250 degrees or lower.

9. The method for manufacturing according to claim 7, wherein, in the upper layer formation step, deposition power for depositing the silicon dioxide film is set to at least 800 W.

10. The method for manufacturing according to claim 7, wherein, in the upper layer formation step, baking temperature for performing baking process on the silicon dioxide film is set to 250 degrees or higher and 350 degrees or lower.

\* \* \* \* \*